Jan. 3, 1967 R. REID 3,296,553

AMPLITUDE LIMITED FREQUENCY STABILIZED OSCILLATOR CIRCUIT

Filed April 23, 1965

INVENTOR
Richard Reid

BY Connolly and Hutz
ATTORNEYS

United States Patent Office 3,296,553
Patented Jan. 3, 1967

3,296,553
AMPLITUDE LIMITED FREQUENCY STABILIZED OSCILLATOR CIRCUIT

Richard Reid, Williamstown, Mass., assignor to Sprague Electric Company, North Adams, Mass., a corporation of Massachusetts Filed Apr. 23, 1965, Ser. No. 450,328
9 Claims. (Cl. 331—109)

This invention relates to oscillator circuits and particularly to negative resistance oscillator circuits.

Oscillator circuits generally are subject to a lack of frequency stability due to inherent circuit limitations. Thus, such oscillators vary in frequency with small deviations in voltage input, load conditions and temperature.

In the prior art, oscillators such as negative resistance types, which employ a resonant branch to determine the frequency, commonly utilize matched reactive elements to provide thermal stability. Thus, an inductor is chosen such that its thermal coefficient of inductance is equal and opposite to the capacitor's thermal coefficient of capacitance. This then results in the maintainance of resonance at the design frequency over the temperature range for which such coefficients are equal and opposite.

This approach while providing some frequency stability is difficult to achieve for operation over a wide temperature range, such as −55° C. to 85° C., since the tolerances of the thermal coefficients are large and the coefficients cannot easily be made precisely equal and opposite.

A further disadvantage of the prior art, as regards negative resistance oscillators, has been the dependence in some cases upon the amplifier of the circuit for limiting. Such limiting is undesirable in precision oscillators since it causes distortion of the output waveform and frequency instability.

It is an object of this invention to overcome the foregoing disadvantages.

It is a further object of this invention to produce a simple inexpensive oscillator having a high degree of frequency stability.

It is a still further object of this invention to produce a precision oscillator having a high degree of frequency stability over a wide temperature and supply voltage range.

These and other objects of this invention will become apparent from the following specification and accompanying drawing in which.

In its broadest scope, the objects set forth are achieved in accordance with this invention by an oscillator circuit in which stability is maintained in effect through control of inductor voltage by means of a temperature sensitive non-linear shunt connected in parellel with the inductor.

In a more limited sense, the objects set forth are achieved in accordance with this invention by an oscillator circuit having a resonant branch therein. The resonant branch comprises a capacitor and inductor with a voltage sensitive temperature responsive shunt connected in parallel to the inductor. The capacitor has a temperature coefficient of capacitance whereas the inductor has a temperature coefficient and a voltage coefficient of inductance. The shunt limits the oscillation amplitude of the circuit and varies the voltage amplitude on the inductor with temperature; thereby varying said inductance with temperature to maintain frequency stability.

Figure 1:
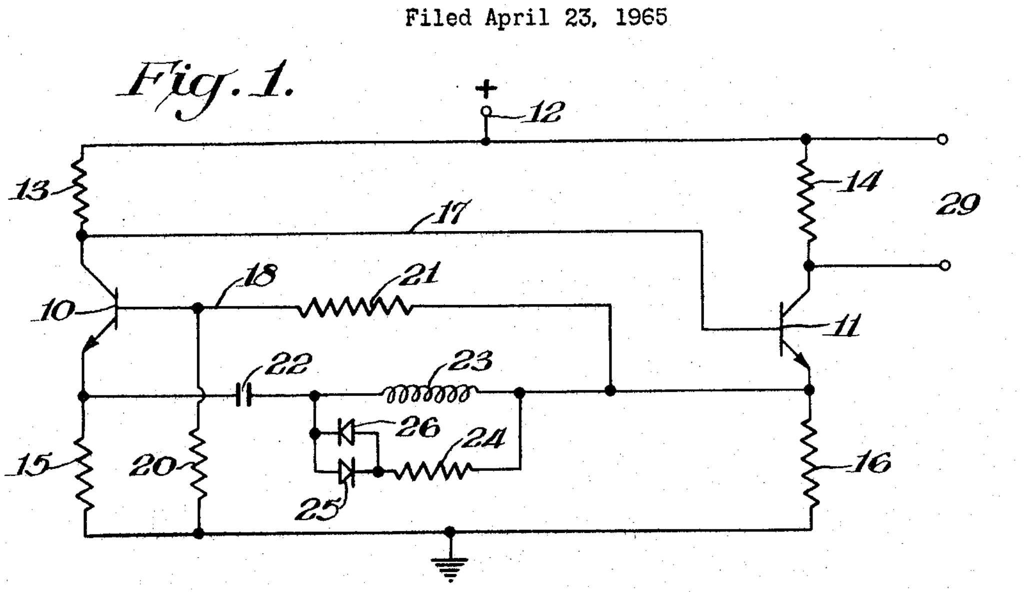
FIGURE 1 is a diagram of an illustrative oscillator circuit in accordance with the invention.

Referring now to FIGURE 1 wherein is illustrated a diagram of an oscillator circuit in which two transistors 10 and 11 are connected to provide an emitter coupled negative resistance oscillator. The transistors employed in the circuit shown are NPN type such as 2N334 or the like; however, other transistors could be used equally well. These include PNP types for which obvious circuit modification would be required.

A positive voltage source 12, of from 4 volts to 22 volts, supplies power to the circuit. The source 12 is connected to the collector of transistor 11 through a 1000 ohm dropping resistor 14 and to the collector of transistor 10 through a 2000 ohm resistor 13. The emitter of transistor 11 is grounded through a 2200 ohm resistor 16 while the emitter of transistor 10 is grounded through a 390 ohm resistor 15.

The base current of transistor 11 is provided by the connection 17 to the collector of transistor 10 while the base current of transistor 10 is provided by a connection through a 6200 ohm resistor 20 to ground and by connection to the emitter of transistor 11 through a negative feedback path 18 which contains a 5100 ohm resistor 21.

Figure 2:
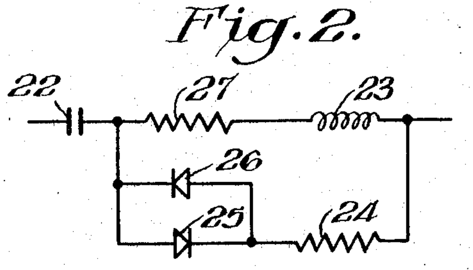
FIGURE 2 is a diagram of the resonant branch of the circuit employed for positive feedback.

Positive feedback is provided by connecting the emitter of each transistor 10 and 11 through a resonant branch shown separately in FIGURE 2. The output 29 of the oscillator is utilized by coupling across resistor 14 as shown. Low temperature coefficient resistors, although not necessary, are desirable for a circuit of high thermal stability.

Referring now to FIGURE 2, wherein is shown the resonant branch which in this embodiment consists of a 0.1 mf. capacitor 22 in series with a shunted 280 mh. inductor 23 and the internal inductor resistance 27. These values will result in resonance at approximately 1000 cps. The shunt of the inductor 23 comprises a 2370 ohm resistor 24 connected in series with two parallel connected diodes 25 and 26. The diodes, which may be 1N659 silicon diodes for example, are connected such that the forward direction of one parallels the reverse direction of the other.

In this embodiment, the capacitor 22 is a polystyrene type with 0.1 uf. capacitance at 25° C. and a temperature coefficient of approximately −120 p.p.m./° C. The inductor 23 is of the molybdenum permalloy core type wound on a linear temperature coefficient toroidal core such that the inductance is 280 mh. at 25° C. and the temperature coefficient of inductance is about +200 p.p.m./° C. Coils of the molybdenum permalloy core type also exhibit a positive voltage coefficient of inductance. Thus, the inductance increases with both coil temperature and voltage. The latter is utilized, by means of the shunt, to provide a second order temperature correction.

The shunt, made up of resistor 24 and diodes 25 and 26, is employed to limit the voltage amplitude of the oscillator to stabilize oscillation as well as increase the frequency stability of the circuit, in a novel manner, by varying the inductance according to temperature.

The shunt is defined as both temperature sensitive and non-linear since its voltage current relationship is a function of temperature and is not a direct proportion relationship.

The shunt limits the voltage across the inductor 23, since on each half cycle of oscillation one of the diodes will draw current when its approximate forward voltage is reached. The switching on of the diode will draw current through the resistor 24, thereby lowering the Q of the resonant branch and effectively limiting the voltage amplitude of the oscillator.

For clarity, the diodes are described as pure switches but in a practical case the change from the nonconducting state to the conducting state is not as abrupt as that developed by a true switch.

Such limiting in the resonant branch of the circuit makes the oscillator less susceptible to instability caused by variations in supply voltage or load conditions. For example, the circuit described in FIGURE 1 will operate satisfactorily with a variation in input of 4 to 22 volts while the load may vary from an open to a short circuit. It should be understood that with short circuit load conditions no useful output is realized although the oscillator still continues to function with the predicted frequency stability.

In addition, the shunt provides a temperature correction since the forward voltage of junction diodes is a function of the diode temperature. Thus, at low temperatures, the forward voltage is greater than at higher temperatures. For example, the approximate forward voltage at which a silicon diode will draw current is .8 volt at −55° C., .5 volt at 25° C. and .3 volt at 85° C. The inductor voltage is then a function of temperature, since it is determined in part by the forward voltage of the diodes in conjunction with the resistor 24. Thus the shunt reduces the peak voltage which occurs across the inductor 23 as the circuit temperature is increased. This results in greater inductance at low temperatures and less inductance at high temperatures than would be anticipated from the temperature coefficient of inductance alone. Thus, additional temperature compensation is realized.

Figure 3:
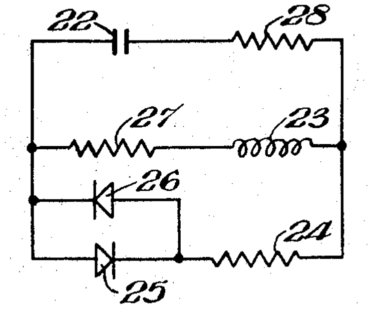
FIGURE 3 is a diagram of the equivalent circuit of the oscillator network as illustrated in FIGURE 1.

Referring now to FIGURE 3, wherein an equivalent circuit is diagrammed, the amplifier portion is shown as a negative resistance 28 in series with the resonant branch of the circuit shown in FIGURE 2. In the ideal case, the amplifier portion, or negative resistance 28, would supply the precise power needed to compensate for circuit losses.

However, in a practical circuit some overdrive must be provided to start and continue oscillation at normal load, temperature and supply voltage variations. Conventional negative resistance oscillators rely on the limiting of the amplifier portion of the circuit to adjust the negative resistance 28 to that value required for steady state oscillation. This type of limiting is undesirable in precision oscillators since it results in distortion of the output waveform and adversely affects operating stability.

In this embodiment, the shunting of the inductor 23 by the resistor 24 and diodes 25 and 26 limits the amplitude of the oscillations to $\pm V/Q$ where V is the peak voltage across the inductor 23 and Q is the average quality factor of the inductor. In the circuit shown, the inductor peak voltage is limited to 0.6 volt at 25° C. by the shunt and the Q is approximately 8. Thus, the amplitude of oscillation is limited to approximately ±.6/8 or ±75 millivolts at 25° C. This method of limiting improves stability under varying supply voltage and load conditions.

Figure 4:
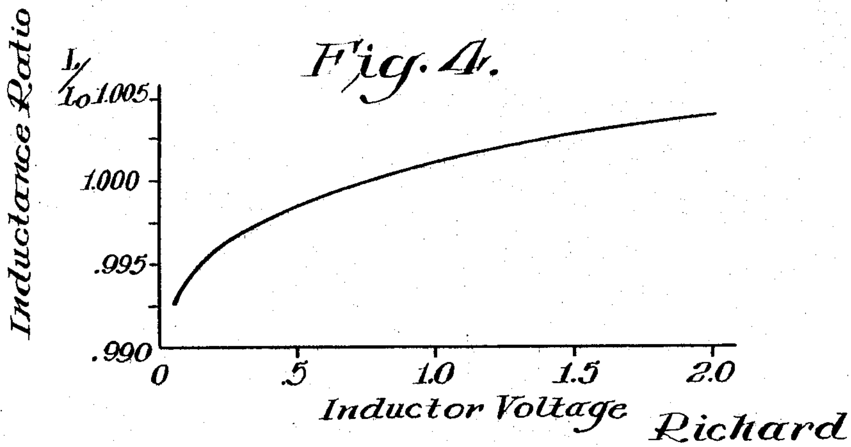
FIGURE 4 is a graph of the voltage dependence of the inductor.

Further, as indicated, the diode forward voltage is a function of temperature. The 0.6 volt given in the example above is only true at 25° C. Whereas at −55° C. the limiting voltage on the inductor 23 is greater than the above value and at +85° C. it is less. Thus, the inductance voltage is varied with temperature which results in a variation in inductance since, as can be seen in FIGURE 4, the inductance is a function of voltage. Such inductive variation is utilized to produce the frequency stability of the circuit by adding a corrective factor to the temperature coefficient of inductance thereby more closely matching the total inductive value to the capacitive value over the temperature range of −55° to +85° C.

The variation in inductance is plotted in FIGURE 4, for convenience, as a function of voltage whereas in general such variation is a function of flux density which is dependent on many coil parameters. Thus the curve shown, although typical of molybdenum permalloy core inductors, is true only for the particular inductor used in this embodiment. The inductor employed in the described circuit had, as indicated above, a molybdenum permalloy core having a permeability of 200, a cross section of .035 sq. in., a mean magnetic path length of approximately 2 in., and 1500 turns.

In the described embodiment, silicon diodes are indicated as suitable. However, germanium diodes may also be utilized in which case the lower forward voltage of these diodes will accordingly reduce the output voltage of the oscillator.

The preferred embodiment described herein employs an inductor and a capacitor wherein the positive thermal coefficient of inductance is of greater magnitude than the negative temperature coefficient of capacitance; however, frequency stability may also be maintained in accordance with this invention in circuits in which the positive thermal coefficient of inductance is of less magnitude than the negative thermal coefficient of capacitance. In such case, if the voltage coefficient of industance is positive, frequency stability is maintained by employing a suitable shunt which increases rather than decreases the inductor voltage with temperature.

A further modification of the above embodiments would be a circuit of the type described in which an inductor having a negative voltage coefficient of inductance is employed. Again frequency stability may be maintained by utilizing a suitable shunt to vary the inductance, appropriately with temperature.

Other combinations readily suggest themselves. For example, where the thermal coefficient of industance is negative and the thermal coefficient of capacitance is positive. In each case, by utilizing the voltage coefficient of inductance with a suitable shunt the required frequency stability may be maintained.

The invention may also be employed in high voltage circuits in addition to the low voltage circuit described herein. In such a case, it would be desirable to raise the impedance level of the inductor and the shunt to provide limiting commensurate with the higher voltage level.

Although the invention has been described in terms of a specific example, it should be understood that many different embodiments of this invention may be made without departing from the spirit and scope thereof and that the invention is not limited except as defined in the appended claims.

What is claimed is:

1. An oscillator comprising an oscillator circuit having a resonant branch therein, said branch having a capacitor and inductor therein, said capacitor being temperature sensitive, said inductor being temperature sensitive, and voltage sensitive, and said branch having a temperature sensitive non-linear shunt in parallel connection to said inductor, said shunt limiting the oscillation amplitude of said circuit and varying the voltage amplitude on said inductor with temperature thereby substantially balancing the inductance of said inductor with the capacitance of said capacitor.

2. An oscillator comprising an oscillator circuit having a resonant branch therein, said branch having a capacitor and inductor therein, said capacitor having a substantial temperature coefficient of capacitance, said inductor having a substantial temperature and voltage coefficient of inductance, said temperature coefficient of capacitance opposite to said temperature coefficient of inductance, said branch having a voltage sensitive temperature responsive shunt in parallel connection to said inductor, said shunt limiting the oscillation amplitude of said circuit and varying the voltage amplitude on said inductor with temperature thereby substantially balancing the inductance of said inductor with the capacitance of said capacitor.

3. An oscillator comprising an oscillator circuit having a resonant branch therein, said branch having a capacitor and inductor therein, said capacitor having a substantial negative temperature coefficient of capacitance, said inductor having a substantial positive temperature coefficient and a substantial positive voltage coefficient of inductance, said temperature coefficient of inductance being of greater magnitude than said temperature coefficient of capacitance, and said branch having a voltage sensitive temperature responsive shunt in parallel connection to said inductor, said shunt limiting the oscillation amplitude of said circuit and decreasing the voltage amplitude on said inductor with increasing temperature thereby substantially balancing the inductance of said inductor with the capacitance of said capacitor.

4. The oscillator claimed in claim 1 wherein said resonant branch consists of said capacitor in series connection with said parallel connected inductor and shunt.

5. The oscillator claimed in claim 1 wherein said oscillator circuit consists of a negative resistance circuit.

6. The oscillator claimed in claim 3 wherein said oscillator circuit consists of a negative resistance circuit and said shunt consists of a resistor in series connection with two parallel connected junction diodes, said diodes connected to have opposing forward directions.

7. The oscillator claimed in claim 3 wherein said oscillator circuit consists of a negative resistance circuit, said resonant branch consists of said capacitor in series connection with said parallel connected inductor and shunt, and said shunt consists of a resistor in series connection with two parallel connected junction diodes, said diodes connected to have opposing forward directions.

8. A resonant circuit comprising a temperature sensitive capacitor in connection to a temperature and voltage sensitive inductor, and a voltage sensitive temperature responsive shunt in parallel connection to said inductor, said shunt varying the voltage across said inductor with temperature thereby substantially balancing the inductance of said inductor with the capacitance of said capacitor.

9. An amplitude limited and frequency stabilized oscillator comprising a pair of transistors, a pair of input terminals connected to the emitter and collectors respectively of said transistors for the supply of input voltage, a pair of output terminals connected across a load resistor in the collector circuit of one of said transistors, the collector of a first of said transistors connected to the base of the second of said transistors, a negative feedback loop connected between the base of said first and the emitter of said second transistor, and a positive feedback resonant branch connected between the emitter of said first and said second transistors, said branch comprising a capacitor and a voltage sensitive inductor in resonant combination and a temperature responsive non-linear shunt connected in parallel with said inductor, said shunt limiting the oscillation amplitude of said circuit and varying the voltage of said inductor with temperature to control its inductance and thereby substantially balance it with the capacitance of said capacitor.

References Cited by the Examiner

UNITED STATES PATENTS

| | | | |
|---|---|---|---|
| 2,584,592 | 2/1952 | Kehbel | 334—6 |
| 2,587,294 | 2/1952 | Dorbec | 331—183 |
| 3,137,826 | 6/1964 | Boudrias | 331—116 |

FOREIGN PATENTS

| | | |
|---|---|---|
| 947,745 | 7/1949 | France. |

NATHAN KAUFMAN, *Primary Examiner.*

J. KOMINSKI, *Assistant Examiner.*